United States Patent [19]

Chan et al.

[11] Patent Number: 4,488,354

[45] Date of Patent: Dec. 18, 1984

[54] METHOD FOR SIMULATING AND TESTING AN INTEGRATED CIRCUIT CHIP

[75] Inventors: Kasun K. Chan, Del Mar; Gerald J. Erickson, San Diego; David B. Schuck; James W. Stone, both of Escondido, all of Calif.

[73] Assignee: NCR Corporation, Dayton, Ohio

[21] Appl. No.: 321,370

[22] Filed: Nov. 16, 1981

[51] Int. Cl.³ .................... H05K 3/36; G01R 3/00; H01K 1/12

[52] U.S. Cl. ........................ 29/830; 29/593; 324/73 R; 324/73 PC; 361/412; 361/415; 364/490

[58] Field of Search ............ 29/830, 593; 324/73 R, 324/73 AT, 73 PC, 158 R, 158 F; 361/415, 412; 364/490, 491; 339/18 B, 18 R

[56] References Cited

U.S. PATENT DOCUMENTS

| | | | |
|---|---|---|---|
| 3,923,360 | 12/1975 | Rougon | 774/68.5 X |
| 4,055,806 | 10/1977 | Patel | 324/73 R X |
| 4,134,631 | 1/1979 | Conrad et al. | 361/415 X |
| 4,401,351 | 8/1983 | Record | 361/415 X |

FOREIGN PATENT DOCUMENTS 234160 11/1963 Austria ................................ 361/412

OTHER PUBLICATIONS

P. Rony, D. Larsen & R. Braden, The Bugbook I, (1974), Unit No. 1, (Published by E&L Instruments, Inc., Derby, Conn.).
Interdesign, Inc., Semicustom Integrated Circuits, (Advertising Brochure)-Undated.

Primary Examiner—Howard N. Goldberg
Assistant Examiner—Carl J. Arbes
Attorney, Agent, or Firm—J. T. Cavender; Edward Dugas; Stephen F. Jewett

[57] ABSTRACT

A method and apparatus for simulating custom chips to be used in a data processing system. Each chip is simulated by a chip simulator that includes a mother board and a plurality of baby boards mounted and interconnected on the mother board. Each baby board has circuit components mounted thereon for performing the circuit function of one cell of the chip. Chip simulators are interconnected in an interconnecting apparatus that supports the mother boards in parallel and spaced apart relation. Chip simulators that represent all of the chips found on a single printed circuit board in the system are interconnected at the interconnecting apparatus so that design errors which are only evident when the chips are interconnected can be tested for and detected prior to fabrication of the chips.

10 Claims, 6 Drawing Figures

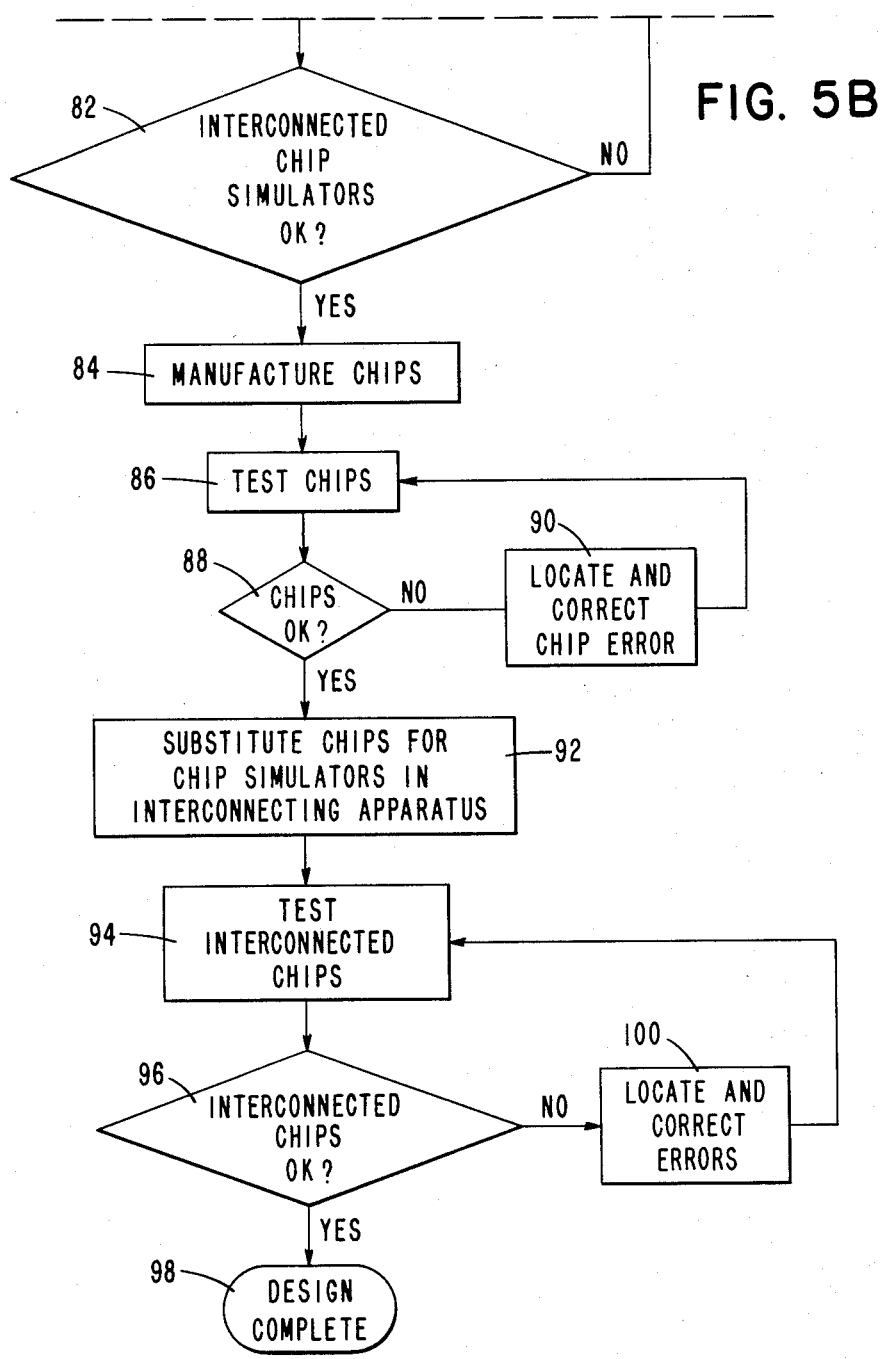

METHOD FOR SIMULATING AND TESTING AN INTEGRATED CIRCUIT CHIP

BACKGROUND OF THE INVENTION

The present invention relates to integrated circuit chips and, in particular, to a method and apparatus for conveniently testing the design of such chips prior to their fabrication.

Electronic systems of all types, including computer systems, are largely constructed from integrated circuit chips. The design of such systems is quite different from systems that employ only discrete circuit components.

For example, the designer of such systems must normally make an initial choice of whether the integrated circuit chips selected for use in the system either should be "off-the-shelf" or standard chips that are readily available or should be custom chips that are designed for that particular system. Standard chips usually have the advantage of low cost. In addition, since they are readily available, they can be incorporated into the system early in its development, so that the system can be tested even though it is only partially constructed. However, standard chips normally have the disadvantage of not being able to perform uncommon or complex circuit functions. If a complex circuit function is needed, usually several such standard chips must be interconnected to each other.

Custom or customized integrated circuit chips, on the other hand, can be designed so that a complex or uncommon circuit function can be performed by a single chip. However, custom chips have the disadvantages of being more expensive than standard chips and of normally requiring a great deal of manufacturing time after the final design of the system is decided upon.

In the design of a large computer system, the amount of time that it takes to manufacture a custom integrated circuit chip after a final system design can lead to difficulties in testing the operation of the entire system. For example, while individual circuit designs can often be simulated and tested using conventional software techniques, such as by use of the well-known TEGAS programming language, the known techniques do not permit the entire system to be accurately simulated so that problems encountered only when two or more of the chips are interconnected are made evident and can be isolated for correction. Accordingly, it is not until the actual chips have been manufactured, sometimes as much as six months or more after the design is finalized, that the system can be tested for problems of this type.

Often it is only after all the chips are available that such problems can be detected. For example, an integrated circuit chip may have digital logic circuitry that is logically accurate but that gives rise to slight clocking or synchronizing errors that cause data to be generated slightly ahead or behind its expected occurrence. This will often significantly affect some other chip whose operation is dependent upon such data. If such an error is not detected until the chips have been manufactured, which may be several months after all chip designs have been finalized, it is necessary for the chip giving rise to the error to be redesigned and again manufactured. Of course, the final assembly of the entire system is delayed until the redesigned chip is manufactured.

There has therefore arisen the need, in a method for manufacturing integrated circuit chips, for a method and apparatus for simulating and testing each of the chips that are designed for a large system, so that difficulties which will occur as a result of interconnecting the chips will become evident prior to their manufacture.

SUMMARY OF THE INVENTION

There is provided, in accordance with the present invention, a method or technique for testing the circuit design of an integrated circuit chip before the manufacture of the chip, such a method including the steps of constructing a chip simulator and then testing the chip simulator.

In particular, the method according to the present invention includes the step of constructing a chip simulator for each custom chip to be included in a data processing system. Each chip simulator comprises a mother board having a plurality of baby boards mounted and electrically interconnected thereon. Each baby board has circuit components so that it represents a portion of the circuitry on the simulated chip. In the preferred embodiment, the portion of the circuitry represented by each baby board is one cell. The term "cell", as used herein, means the basic building block or element of the circuitry in the integrated circuit chip and, depending upon the type of chip or the degree of customizing involved, could be as basic as a single transistor or as complex as, for example, an eight-bit adder. In the disclosed embodiment, the method and apparatus of the present invention is used in the design and manufacture of a MACROCELL integrated circuit chip. The MACROCELL chip is commercially available in a semicompleted form from Motorola Semiconductor Products, Inc., Phoenix, Ariz., and the purchaser customizes the chip by completing the design to include the cells that he desires. The "cells" that can be incorporated on such chip can include individual logic gates as well as more complex circuits, such as priority encoders.

After the design of a chip is completed and the chip simulator for that chip is constructed, the chip simulator is then individually tested for any design errors. As the designs for other chips are finalized, chip simulators for those chips are also made. When all of the chip simulators for the chips that would be located on a single printed circuit board in the actual system have been implemented in the form of a chip simulator, chip simulators are assembled in an interconnecting apparatus. The interconnecting apparatus interconnects the mother boards of each chip simulator so that the chip simulators can be tested while interconnected in the same way that the actual chips of the system would be interconnected.

It is, therefore, an object of the present invention to provide an improved method and apparatus for testing the design of integrated circuit chips.

It is another object of the present invention to provide a method for testing a prototype of a data processing system that uses custom integrated circuit chips.

Still another object of the present invention is to provide a method permitting the testing of circuitry in a system prior to the manufacture of chips to be used in such system.

These and other objects of the present invention will become apparent when taken in conjunction with the following description and the attached drawings.

BRIEF DESCRIPTION OF THE DRAWINGS

FIGS. 5A and 5B are a flow diagram illustrating the steps of a preferred method for simulating and testing integrated circuit chips in accordance with the present invention.

DETAILED DESCRIPTION OF THE PREFERRED EMBODIMENT

Figure 1:
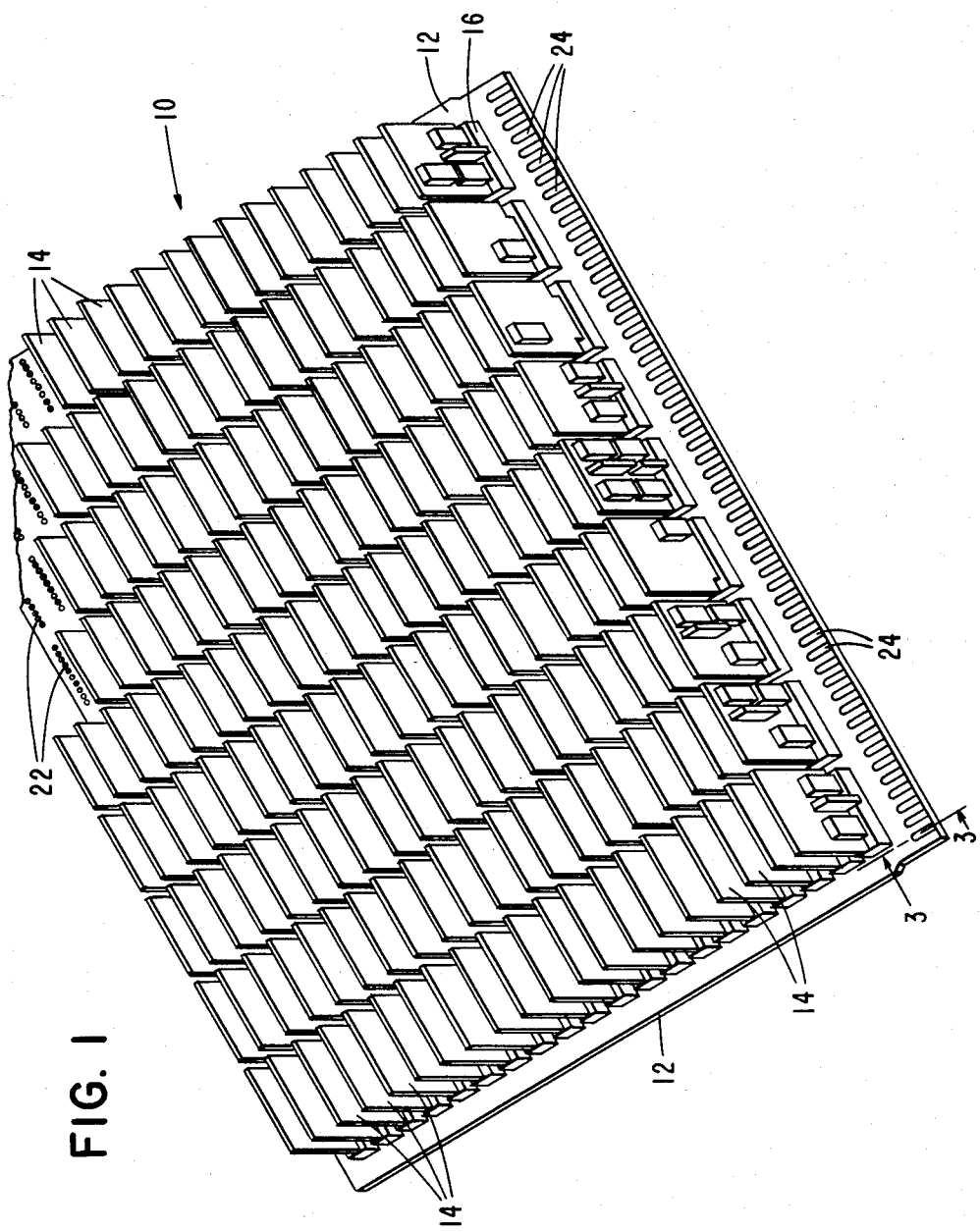
FIG. 1 is a fragmentary perspective view of a chip simulator in accordance with the present invention.

Referring to FIG. 1, there is shown a chip simulator 10 in accordance with the present invention. The chip simulator 10 includes a mother circuit board 12 upon which are mounted and electrically interconnected a plurality of baby circuit boards 14. Each baby board 14 is electrically connected to the mother board 12 by way of a conventional connector 16. As depicted for only some of the baby boards 14 in FIG. 1, electrical components are mounted and electrically interconnected on each of the baby boards 14.

Figure 2:
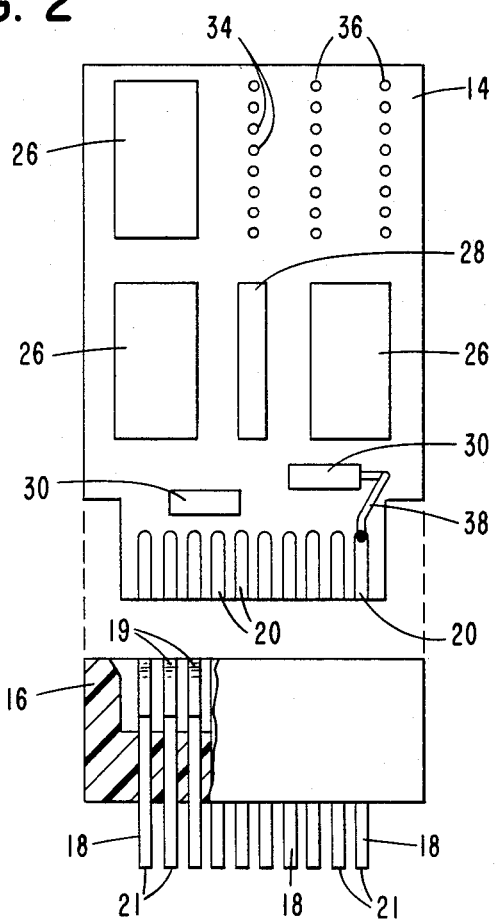
FIG. 2 is a plan view, with portions broken away, illustrating one baby board and its associated connector used in the chip simulator of FIG. 1.

Each of the baby boards 14, as illustrated by FIG. 1 and by the enlarged view of one baby board 14 in FIG. 2, is a multilayer printed circuit board and is constructed using a conventional multilayer printed circuit board process. In the preferred embodiment, each baby board 14 normally represents one cell of the integrated circuit chip which is simulated by the chip simulator 10. The electronic components mounted on each baby board are chosen to have, when interconnected on the baby board, the same logic function as the cell represented by the baby board. As seen best in FIG. 2, each connector 16 receives one edge of its associated baby board 14 and is of a conventional construction, having conductive pins 18 with internal contact ends 19 within the connector that make electrical contact with conductive board terminals 20 on the inserted baby board. The pins 18 also have opposite external ends 21 that project from the side of the connector opposite the inserted baby board and that pass through apertures 22 (FIG. 1) in the mother board 14. As will be described later in conjunction with FIG. 3, the pins 18 are exposed on the back side of the mother board 12 and may be electrically interconnected to each other by a conventional wire wrapping process.

The electrical connections between each of the baby boards 14, by way of the connectors 16 and the wire wrapping done at the mother board 12, represent the electrical connections that would be made between the cells of the custom integrated circuit chip being simulated by the chip simulator 10. The result, of course, is that the chip simulator 10, with the electronic components on each of the baby boards 14 electrically interconnected on the mother board 12, can be made both logically and operationally equivalent to the integrated circuit chip that it simulates.

The mother board 12 (FIG. 1) is a single plane or layer circuit board, and is constructed using a conventional single layer printed circuit board process. The mother board 12 has a set of conductive input/output board terminals 24 (FIG. 1) along one edge thereof which are connected to the connectors 16 by the previously-mentioned wiring on the backside of the mother board and which represent the input/output terminals or pins of the simulated chip. For example, in the specific use of the chip simulator 10 to be described shortly, each simulated chip has sixty input/output pins or terminals and there would be a corresponding sixty terminals 24 along the edge of the mother board 12.

In the preferred embodiment, the chip simulator 10 is used to simulate a MACROCELL integrated circuit chip. As mentioned earlier, the MACROCELL chip is commercially available in partially fabricated form. Each chip has sufficient space for one hundred and six cells, and each cell can be any one of ninety-six standard logic components that include gates, flip-flops, adders, latches, and priority encoders. The chip is initially fabricated to an incomplete state where it has unconnected transistors and resistors in each of the one hundred and six cells on the chip. A finishing step, referred to as a "metalization" step, is done only after the user selects the type of standard logic component that is to be fabricated at each cell location. During the metalization step, the transistors and resistors within each cell are interconnected, and then the cells themselves are interconnected, thus permitting the user to determine for the most part the logic functions that can be accomplished by the chip.

The specific processes for fabricating or customizing MACROCELL chips are not part of the present invention. A more detailed description of MACROCELL chips can be found in publications available from Motorola Semiconductor Products, Inc., including "The MECL 10,000 MACROCELL Array Preliminary Design Manual", Second Printing (1979). As should be apparent, the present invention can be used in connection with the manufacture of any chip, and is not limited to the MACROCELL chip.

The baby board 14 seen in FIG. 2 with its associated connector 16 is a multilayer printed circuit board and, when used to simulate one cell of a MACROCELL chip, has five layers of conductors that are separated by insulating layers and that terminate at the previously mentioned terminals 20. The terminals 20 are located on both sides along the edge of the baby board 14 that is inserted into its associated connector 16. The terminals 20 provide an electrical path between the electronic components mounted on the baby board and the internal contact ends 19 of the pins 18 within the connector 16.

In the preferred embodiment, all of the baby boards 14 are constructed with sufficient room to mount a variety of components so that each board can represent any one of the ninety-six standard MACROCELL logic components. The baby board 14 seen in FIG. 2 is illustrated as having three integrated circuit chips housed in DIP packages (dual-in-line packages) 26 and one chip housed in an SIP package (single-in-line package) 28. In addition, discrete circuit components may be mounted on the baby board, such as two capacitors 30 that simulate the capacitive characteristics of the cell. The baby board 14 in FIG. 2 is also seen to include a row of empty plated-through holes 34 for receiving the terminals of an additional SIP and two rows of empty plated-through holes 36 for receiving the terminals of an additional DIP, which would be occupied if a more complex cell were to be simulated. Only one conductor 38 is shown connecting one of the capacitors 30 to one of the terminals 22, and it should be apparent that each of the layers of the printed circuit board would have numerous ones of such conductors interconnecting the various components mounted on the baby board 14. The DIP's 26 and the SIP 28 are conventional 10K ECL logic circuits which, when interconnected on the baby board 14 with any other components, are operationally and logically equivalent to the simulated cell.

As seen in FIG. 1, the baby boards 14 are mounted on the mother board 12 in parallel rows and each extends in a substantial perpendicular direction from the mother board. This arrangement not only permits the large number of baby boards needed to represent all of the cells on the simulated chip, but also permits air flow for dissipating heat generated by the components mounted on the baby boards. Enough clearance is provided between the rows of baby boards to allow for both the space required for the mounted components, and permit the passage of air.

Figure 3:
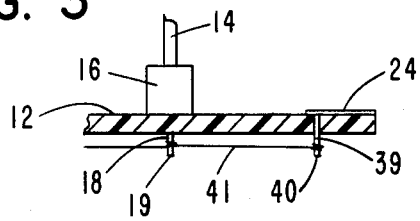
FIG. 3 is a fragmentary sectional view of the chip simulator, taken along line 3—3 of FIG. 1.

In FIG. 3 there is shown a partial sectional view of the mother board 12, including one of the connectors 16 and a portion of its associated baby board 14. As can be seen in FIG. 3, each of the terminals 24 includes a pin 39 that extends through the mother board 12 and has an end 40 that is exposed, along with the ends 19 of the pins 18, at the back side of the mother board. Wiring 41 is wrapped around and extends between the exposed ends 19 of the pins 18 and the exposed ends 40 of the pins 39. The wiring 41, as mentioned earlier, electrically interconnects the baby boards 14 to each other and to the terminals 24.

A significant advantage of the chip simulator 10 illustrated in FIGS. 1, 2 and 3 is that it permits the testing of a physical prototype of a system that is comprised of a plurality of custom chips, without having to first manufacture the chips. As mentioned earlier, some problems encountered with an integrated circuit chip are not made evident until after each chip is constructed and it is interconnected with other chips. Since the chip simulator 10 of FIG. 1 represents a physical prototype of one chip, the chip simulator 10 may be interconnected with other chip simulators in the same fashion that the chips they represent would be interconnected when forming part of a system. Circuit problems arising from such interconnections could then be tested for and could be isolated using the chip simulator 10, rather than waiting for the complete fabrication or manufacture of the actual chips.

Figure 4:
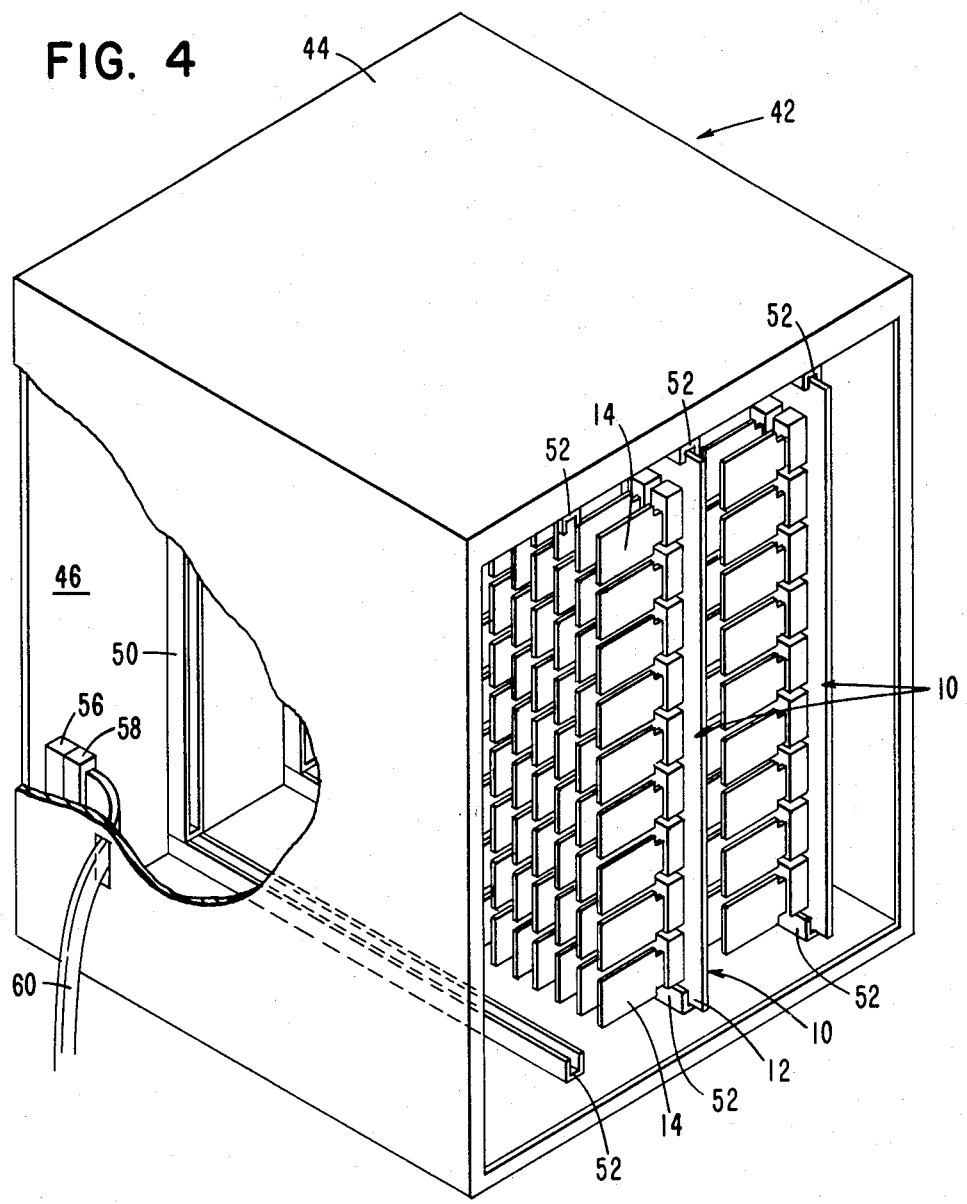
FIG. 4 is a perspective view, with portions broken away, of an interconnecting apparatus for connecting plural chip simulators.

In FIG. 4 there is illustrated an interconnecting apparatus 42 for interconnecting plural chip simulators 10. In particular, the apparatus 42 is used to interconnect the chip simulators 10 and such other circuitry as may be needed to represent a prototype of a single printed circuit board within the system that uses the chips being simulated. Such a single printed circuit board might have, say, eight customized MACROCELL chips and additional standard circuitry external to the custom chips. In order to test the customized chips as they would be interconnected, the chip simulators 10 could be interconnected, along with such additional standard circuitry that could be mounted on a separate board, within the apparatus 42.

The interconnecting apparatus 42 seen in FIG. 4 includes a housing 44 which has a single plane backpanel 46. The backpanel 46 includes suitably spaced, conventional elongated backpanel connectors 50, each connector 50 for receiving and making electrical contact with the terminals 24 on the edge of one mother board 12. Upper and lower tracks 52 within the housing 44 guide the motor boards 12 for connection at the backpanel 46 and support the mother boards so they are parallel to each other and suitably spaced apart within the housing 44.

Although only two chip simulators 10 are seen in the apparatus 42 in FIG. 4, with an additional pair of tracks 52 for receiving another chip simulator 10, it should be appreciated that the number of chip simulators 10 that would be interconnected within the interconnecting apparatus 42 would depend upon the particular printed circuit board being simulated. In a data processing subsystem using MACROCELL chips, the number of chip simulators on a standard-sized printed circuit board might, for example, be eight, and the housing 44 would have to be a suitable size to accommodate eight chip simulators 10 as well as an additional board for standard circuit components external to the chips.

The interconnecting apparatus 42 as shown is identical in construction to a conventional computer mainframe housing, wherein multiple printed circuit boards are interconnected at a backpanel. As conventional, the backpanel 46 has pins (not shown) projecting from the connectors 50 and extending through the backside of the backpanel that could be suitably connected, such as by wire wrapping, to each other and to pins (not shown) of a connector 56 that is seen toward the left hand side of FIG. 4. Of course, by this arrangement the board terminals 24 on each mother board 12 are connected to the board terminals 24 on the other mother boards 12 in the apparatus 42 in the same fashion that the chip terminals on the chip it simulates are connected to chip terminals of other chips in the system.

The connector 56 receives a conventional male paddle plug 58 that is provided at one end of a ribbon cable 60. The ribbon cable 60, paddle plug 58, connector 56, and the wiring that would interconnect the pins on the connector 56 to the pins of the connectors 50 provide suitable electrical connections between the chip simulators 10 within the housing 44 and chip simulators or other circuitry that would be mounted elsewhere. In particular, if the illustrated interconnecting apparatus 42 in FIG. 3 represents the actual chips and circuitry that would be found on one printed circuit board in a system, the cable 60 would lead to similar interconnecting apparatus positioned nearby (but not shown) that might represent chips found on other printed circuit boards. In this fashion, for example, the entire data processing system, or any substantial portion of it that would be constructed from MACROCELL chips, could be simulated and tested.

The arrangement of the baby boards 14 on the mother boards 12, and the arrangement of the mother boards 12 in the interconnecting apparatus 42, permit the passage of air between the mother boards and between the baby boards on each mother board, to dissipate the heat generated by the circuit components mounted on the baby boards. Although not illustrated in the drawings, air openings could be located at the top and bottom of the housing 44 and air could be forced, by a fan or the like, through the housing and between the baby boards 14 in order to aid in such dissipation.

Figure 5A:
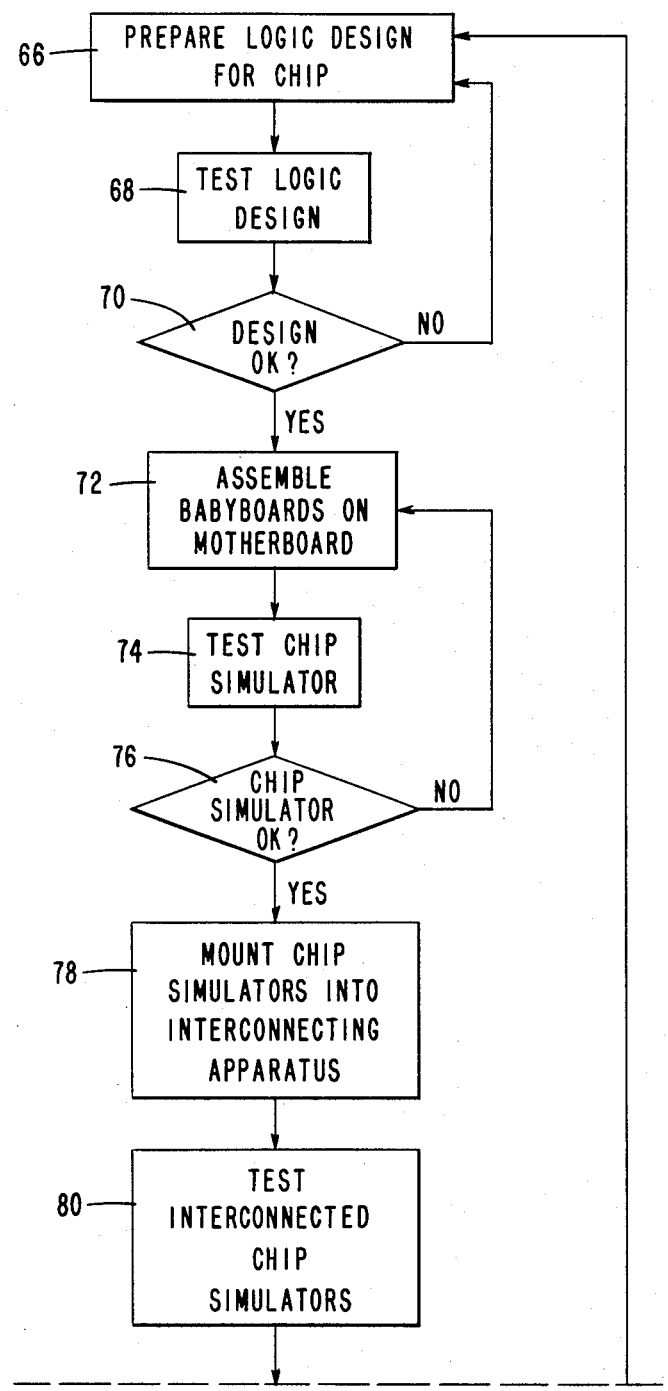

Turning now to FIGS. 5A and 5B, there is illustrated the steps of the method for manufacturing and testing an integrated circuit chip in accordance with the present invention, using the chip simulators 10 and interconnecting apparatus 42 of FIGS. 1 through 4. The first three steps are conventional chip manufacturing steps and include preparing a circuit or logic design for the chip, step 66, testing the logic design, step 68, and determining if the testing has located any design errors, step 70. In the preparation of a logic design for a MACROCELL chip, a circuit designer would normally first determine the logic functions that need to be performed by the chip. In step 66, he selects circuit functions from the available ninety-six standard MACROCELL components and determines how the cells on the MACROCELL chip are to be interconnected. He can test the logic design at step 70 by using, for example, the previously mentioned TEGAS programming language to make sure that the proper output signals for the chip design will occur for each possible set of input signals. If a design defect is detected at step 70, then he returns to step 66 and the design originally prepared is changed as needed to correct the defect.

Once the design is correct, a chip simulator is constructed in accordance with the present invention by assembling and mounting the baby boards 14 representing all the cells of the simulated chip on the mother board 12, step 72. Of course, the types of cells that will be incorporated on each chip will normally be known in advance and, accordingly, in the design of a large system, a large number of baby boards having components thereon for each possible cell would preferably be produced and provided in advance so that minimal time is required for producing the chip simulator.

Once the baby boards have been assembled on the mother board to represent each cell on the simulated chip, and the baby boards have been electrically interconnected, such as by the wire wrapping previously discussed, the chip simulator is tested, step 74. Normally, the same test data that was used at step 68 to test the logic design could also be used at step 74, to verify that the logic functions performed by the chip simulator are identical to the logic functions of the design prepared at step 66. Such a test could include, as conventional, supplying a set of input signals stimuli, or test data to the input terminals of the mother board and determining if the expected output signals appear at the output terminals.

If the testing of the chip simulator indicates that an error exists, step 76, the chip simulator can be reassembled, at step 72, to correct the error. When several of the chip simulators have been successfully tested, they are mounted and interconnected, at step 78, within the interconnecting apparatus 42 that has been previously described in conjunction with FIG. 4. Preferably, the interconnected chip simulators in the apparatus 42 would represent all the circuitry, including the simulated chips and other standard circuit components, that would be mounted on a single printed circuit board in the system that is being designed. The interconnected chip simulators are then tested at step 80 for such errors that would otherwise only arise when the physical chips themselves are interconnected. As in step 74, a conventional testing method could be used at this step 80, by supplying input signals or stimuli to the connected chip simulators and determining if the proper expected output signals appear.

If the testing indicates, at step 82, that an error has occurred, then the logic design prepared at step 66 may be changed as needed.

Once the interconnected chip simulators have been successfully tested and found to correctly perform the functions of the chips they simulate, and no error is found at step 82, the chips can be manufactured at step 84. The manufactured chips are then tested, for example, to isolate defects that may have occurred during manufacture, at step 86. If a chip defect is found on any chip, step 88, then the chip may be discarded at step 90 and new chips tested again at step 88 until a sufficient number of defect-free chips are obtained. It is an important aspect of the present invention that defects found during the chip testing at step 86 should not result from design errors, since any errors not found at step 68 or step 74 will have been made apparent by the testing of the interconnected chip simulators at step 80. Rather, defects or errors at this stage will probably be due to physical defects resulting from manufacturing errors or defects in the material used in the chips.

Once the chips have been found to be defectfree, they can then be substituted for the chip simulators, step 92. This could be accomplished, for example, by mounting each manufactured chip on a single board, of the same size as the mother board 12 (FIGS. 1 and 4), with each pin or terminal of the chip electrically connected to one of the terminals on the edge of the board, and then inserting the board in the place of the chip simulator 10 into the interconnecting apparatus 42. Once all the chips have been substituted for the chip simulators at step 92, the interconnected chips can be tested, step 94. In addition, a final prototype of the system or subsystem in which the chips are used could be assembled and tested. Again, errors found at this step should not result from design errors because of the previous testing of the chip simulators.

If the interconnected chips are successfully tested, step 96, then the design of the system has been completed, step 98, and production models of the system can be manufactured. Of course, if during this testing errors or defects are detected, step 96, such errors would have to be corrected, step 100. However, since chip design errors would in most cases have already been detected and corrected by using the chip simulators 10 in steps 72 through 82, and chip manufacturing defects would have been detected and corrected in steps 86 through 90, errors at this point should be minimal and, if present, due to such things as assembly errors in step 92.

Although a presently preferred embodiment of the present invention has been described, it should be apparent that within the purview of this invention various changes may be made within the scope of the appended claims.

What is claimed is:

1. In a method for testing a system that includes a plurality of interconnected integrated circuit chips, a process for simulating said chips in order to test the circuit design for said system prior to the manufacture of said chips, said process for simulating comprising:

A. providing a plurality of chip simulators, each of said chip simulators comprising:
 a. a mother circuit board; and
 b. a plurality of baby circuit boards each including circuit components interconnected thereon for performing the function of a portion of the circuitry to be on one of said circuit chips, said baby circuit boards being interconnected on said mother circuit board so that together they will perform the function of said one of said circuit chips;

B. interconnecting said chip simulators, so that the interconnected chip simulators will perform the function of said integrated circuit chips in said system; and C. testing the interconnected chip simulators to determine errors in the circuit design of said system D. then disconnecting and removing said baby circuit boards from said mother board for one or more of said chip simulators in order to prepare for a subsequent simulation of circuit chips.

2. The process of claim 1, wherein the step of interconnecting said chip simulators includes electrically connecting each of said chip simulators to the other of said chip simulators in the same way as said circuit chips are to be interconnected in said system.

3. The process of claim 2, wherein each of said chip simulators comprises a mother circuit board having input/output board terminals corresponding to input/output chip terminals for one of said circuit chips, and wherein the step of interconnecting said chip simulators includes the step of interconnecting said board terminals in the same way as said chip terminals would be interconnected to interconnect said circuit chips in said system.

4. The process of claim 2 wherein for each of said chip simulators, said mother circuit board is produced by using a single layer printed circuit board process; wherein each of said baby boards is produced by using a multilayer printed circuit board process; and wherein for each of said chip simulators, said baby circuit boards are mounted on said mother board, so that said baby boards each extend in a substantially perpendicular direction from said mother board.

5. The process of claim 4, wherein each of said baby circuit boards is mounted on its respective mother circuit board by means of a connector having a plurality of pins, each of said pins being electrically connected to the baby circuit board received by said connector;

each of said connectors being mounted on said mother circuit board so that said pins extend through said mother circuit board;

and wherein said baby circuit boards are interconnected by interconnection of said pins using a wire wrapping process.

6. The process of claim 5, wherein the step of interconnecting said chip simulators includes the step of supporting their respective mother circuit boards in parallel, spaced-apart relation to each other to permit the passage of air between the supported mother circuit boards and between said baby boards on said mother circuit boards.

7. The process of claim 4, wherein said baby boards are arranged in parallel rows on said mother board.

8. A method for simulating and testing the operation of circuitry on an integrated circuit chip, wherein the circuit chip includes a plurality of circuit cells, where said method comprises:

providing a baby board for each of said circuit cells, each baby board having mounted thereon circuit components performing the logic function of one of said circuit cells;

providing a mother board;

mounting the baby boards on said mother board;

interconnecting said baby boards so that the interconnected baby boards perform the logic function of said integrated circuit chip;

testing the interconnected baby boards to determine the operation to be expected of said integrated circuit chip; and then disconnecting and removing said baby circuit boards from said mother board in order to prepare for a subsequent simulation and testing of an integrated circuit chip.

9. A method for manufacturing a system that includes a plurality of interconnected integrated circuit chips, said method comprising:

A. providing a plurality of chip simulators, each of said chip simulators comprising:
  a. a mother circuit board; and
  b. a plurality of baby circuit boards each including circuit components interconnected thereon for performing the function of a portion of the circuitry to be on one of said circuit chips, said baby circuit boards being interconnected on said mother circuit board so that together they will perform the function of said one of said circuit chips;

B. interconnecting said chip simulators, so that the interconnected chip simulators will perform the function of said interconnected circuit chips in said system, whereby the interconnected chip simulators may be tested to determine errors in the circuit design of said system; and C. testing said interconnected chip simulators and thereby determining the errors, if any, in the circuit design of said system;

D. determining an error-free circuit design for said system by repeating steps A, B and C if and as may be necessary; and E. manufacturing said integrated circuit chips in accordance with said error-free circuit design.

10. A method for manufacturing an integrated circuit chip, wherein the circuit chip includes a plurality of circuit cells, where said method comprises:

(a) providing a baby circuit board for each of said circuit cells, each baby board having mounted thereon circuit components performing the logic function of one of said circuit cells;

(b) providing a mother board;

(c) mounting the baby boards on said mother board;

(d) interconnecting said baby boards so that the interconnected baby boards perform the logic function of said integrated circuit chip;

(e) testing the interconnected baby boards to determine the operation to be expected of said integrated circuit chip;

(f) determining a desired circuit design for said integrated circuit chip, by repeating steps (a) through (e) if and as may be necessary; and (g) manufacturing said integrated circuit chip in accordance with said desired circuit design.

* * * * *